(12) United States Patent
Shah

(10) Patent No.: US 6,501,099 B2
(45) Date of Patent: Dec. 31, 2002

(54) MODIFIED-ANODE GATE TURN-OFF THYRISTOR

(75) Inventor: Pankaj B. Shah, Silver Spring, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 09/798,585

(22) Filed: Mar. 5, 2001

(65) Prior Publication Data

US 2002/0134992 A1 Sep. 26, 2002

(51) Int. Cl.[7] ............... H01L 31/0312; H01L 29/74; H01L 31/111

(52) U.S. Cl. ............... 257/77; 257/110; 257/115; 257/132; 257/147; 257/157

(58) Field of Search ............... 257/115, 132, 257/138, 139, 147, 77, 157, 120, 110

(56) References Cited

U.S. PATENT DOCUMENTS

| | | | | |
|---|---|---|---|---|
| 5,491,351 A | * | 2/1996 | Bauer et al. | 257/152 |
| 5,539,217 A | * | 7/1996 | Edmond et al. | 257/77 |
| 5,703,383 A | * | 12/1997 | Nakayama | 257/139 |
| 5,814,546 A | * | 9/1998 | Hermansson | 438/309 |
| 5,831,289 A | * | 11/1998 | Agarwal | 257/77 |
| 6,002,143 A | * | 12/1999 | Terasawa | 257/77 |
| 6,107,649 A | * | 8/2000 | Zhao | 257/138 |

OTHER PUBLICATIONS

Shah et al., "In-depth analysis of SiC GTO thyristor performance using numerical simulations", Solid State Electronics, p. 353–358, vol. 44/2, 2000.*

Agarwal et al., "4H–SiC p–n diodes and gate turn–off thyristors for high power, high temperature applications", Solid State Electronics, p. 303–308, vol. 44/2, 2000.*

Azuma et al., "GTO Thyristors", Proc. of the IEEE, vol. 76, p. 419, 1988.*

Dutta et al., "A physical and circuit level approach for modeling turn–off characteristics for GTO's ", IEEE Trans. on Power Elect., vol. 9, p. 560, 1994.*

Yatsuo et al., "Design considerations for large–current GTO's", IEEE Trans. Elect. Dev., p. 1196, vol. 36, 1989.*

Lee et al., "Minimization of current crowding during turn–off of power GTO devices", Power Electronics Specialists Conference, PESC '94 Record, 25$^{th}$ Annual IEEE, p. 442, vol. 1, 1994.*

Li et al., "High current density 800–V 4H–SiC gate turn–off thyristors", IEEE Elect. Dev. Lett., vol. 20, p. 219, 1999.*

(List continued on next page.)

Primary Examiner—Steven Loke
(74) Attorney, Agent, or Firm—Paul S. Clohan, Jr.; Edward L. Stolarun

(57) ABSTRACT

A gate turn-off thyristor includes a substrate formed of n-type silicon carbide; a growth buffer formed of n-type silicon carbide and positioned to overlie said substrate; a field buffer region formed of p-type silicon carbide and positioned to overlie said growth buffer; a drift region formed of p-type silicon carbide and positioned to overlie said field buffer region; a gated base region formed of n-type silicon carbide and positioned to overlie said drift region; a modified anode region formed of first, second and third layers of silicon carbide and positioned to overlie said gated base region, said first layer comprising p-type silicon carbide and disposed adjacent said gated base region, said second layer comprising n-type silicon carbide and disposed adjacent said first layer, said third layer comprising p-type silicon carbide and disposed adjacent said second layer; an anode contact disposed on said third layer of said modified anode region; a cathode contact disposed on said substrate; and a gate contact disposed on said gated base region.

7 Claims, 8 Drawing Sheets

OTHER PUBLICATIONS

Siergiej et al., "Advances in SiC materials and devices: an industrial point of view", Mat. Sci. and Eng. B, vol. 61–62, p. 9, 1999.*

Xie et al., "A high current and high temperature 6H–SiC thyristor", IEEE Elect. Dev. Lett., vol. 17, p. 142, 1996.*

Shah et al., "Two–dimensional numerial investigation of the impact of material–parameter uncertainty on the steady–state performance of passivated 4H–SiC thyristors", J. Appl. Phys., vol. 84, p. 4625, 1998.*

Casady et al., "4H SiC power devices for use in power electronic motor control", Solid State Electronics, vol. 42, 2165, 1998.*

Agarwal et al., "700 V Asymmetrical 4H–SiC Gate Turn–Off Thyristors (GTO)", IEEE Elect. Dev. Lett., vol. 18, p. 518, 1997.*

4H–Silicon Carbide Modified–Anode Gate Turn–Off Thyristor, P.B. Shah, Electronics Letters $30^{th}$ Mar. 2000.

* cited by examiner

MODIFIED-ANODE GATE TURN-OFF THYRISTOR

Some related patents include:
1) Silicon carbide gate turn-off thyristor arrangement, A. K. Agarwal, U.S. Pat. No. 5,831,289;
2) Silicon carbide thyristor, J. A. Edmond, J. W. Palmour, U.S. Pat. No. 5,539,217;
3) Hybrid vertical type power semiconductor device, Y. Terasawa, U.S. Pat. No. 6,002,143;
4) Method for producing a bipolar semiconductor device having SiC-based epitaxial layer, W. Hermansson, U.S. Pat. No. 5,814,546;
5) Power semiconductor device, K. Nakayama, U.S. Pat. No. 5,703,383; and
6) Gate turn-off thyristor, F. Bauer, P. Streit U.S. Pat. No. 5,491,351.

The above listed six patents are hereby expressly incorporated by reference.

STATEMENT OF GOVERNMENT INTEREST

The invention described herein may be manufactured and used by or for the Government of the United States of America for government purposes without the payment of any royalties therefor.

BACKGROUND OF THE INVENTION

The present invention relates in general to high power, high temperature semiconductor electronic switches, and, in particular, to silicon carbide gate turn-off thyristors.

The following publications discuss the problem of hole injection in silicon carbide (SiC) gate turn-off (GTO) thyristors:
1) P. B. Shah, K. A. Jones, A. K. Agarwal, S. Seshadri, "In-depth analysis of SiC GTO thyristor performance using numerical simulations", Solid State Electronics, p. 353–358, vol. 44/2, 2000;
2) A. K. Agarwal, S. Seshadri, M. MacMillan, S. S. Mani, J. Cassady, P. Sanger, and P. Shah, "4H-SiC p-n diodes and gate turn-off thyristors for high power, high temperature applications" Solid State Electronics, p. 303–308, vol. 44/2, 2000; and
3) L. Cao, "4H-SiC gate turn-off thyristor and merged p-i-n and schottky barrier diodes," Ph. D. Dissertation, Rutgers University, New Jersey, 1999.

A general discussion of GTO thyristors may be found in:
1) M. Azuma and M. Kurata, "GTO Thyristors", Proc. of the IEEE, vol. 76, p. 419, 1988; and
2) B. J. Baliga, Power semiconductor devices, PWS publishing company, New York, 1996.

Current crowding in GTO thyristors is discussed in:
1) R. Dutta, C. Tsay, A. Rothwarf, and R. Fischl, "A physical and circuit level approach for modeling turn-off characteristics for GTO's", IEEE Trans. on Power Elect., vol. 9, p. 560, 1994;
2) T. Yatsuo, S. Kimura, Y. Satou, "Design considerations for large-current GTO's", IEEE Trans. Elect. Dev., p. 1196, vol. 36, 1989; and
3) T. K. Lee, Y. C. Liang, "Minimization of current crowding during turn-off of power GTO devices" Power Electronics Specialists Conference, PESC '94 Record, 25th Annual IEEE, p. 442, vol.1, 1994.

Additional information about SiC GTO thyristors appears in:
1) B. Li, L. Cao, and J. H. Zhao, "High current density 800-V 4H-SiC gate turn-off thyristors", IEEE Elect. Dev. Lett., vol. 20, p. 219, 1999;
2) R. R. Siergiej, R. C. Clarke, S. Sriram, A. K. Agarwal, R. J. Bojki, A. W. Morse, V. Balakrishna, M. F. MacMillan, A. A. Burke, Jr., and C. D. Brandt, "Advances in SiC materials and devices: an industrial point of view", Mat. Sci. and Eng. B, vol. 61–62, p. 9, 1999;
3) K. Xie, J. H. Zhao, J. R. Flemish, T. Burke, W. R. Buchwald, G. Lorenzo, and H. Singh, "A high current and high temperature 6H-SiC thyristor," IEEE Elect. Dev. Lett., vol. 17, p 142, 1996;
4) P. B. Shah and K. A. Jones, "Two-dimensional numerical investigation of the impact of material-parameter uncertainty on the steady-state performance of passivated 4H-SiC thyristors", J. Appl. Phys., vol. 84, p. 4625, 1998;
5) J. B. Casady, A. K. Agarwal, S. Seshadri, R. R. Siergiej, L. B. Rowland, M. F. Macmillan, D. C. Sheridan, P. A. Sanger, and C. D. Brandt., "4H SiC power devices for use in power electronic motor control", Solid State electronics, vol. 42, p. 2165, 1998; and
6) A. K. Agarwal, J. B. Casady, L. B. Rowland, S. Seshadri, R. R. Siergiej, W. F. Valek, and C. D. Brandt, "700 V Asymmetrical 4H-SiC Gate Turn-Off Thyristors (GTO)", IEEE Elect. Dev. Lett., vol. 18, p. 518, 1997.

Silicon gate turn-off (GTO) thyristors are quite well developed. Silicon GTO thyristors are used commonly in high power conditioning circuits, in high voltage DC systems, and traction circuits. Silicon carbide (SiC) GTO thyristors, on the other hand, are only recently coming of age because of the difficulty in producing good silicon carbide wafers and epi-layers. Silicon GTO thyristors appear to be inferior to SiC GTO thyristors because of their inability to operate at high temperatures (above ~150° C. junction temperatures). Further, silicon GTO thyristors tend to turn off slowly if designed to block very high voltages. Silicon carbide offers greater benefits than silicon for high power devices. These benefits include a higher thermal conductivity, a higher critical electric field at which breakdown occurs, and a high saturated carrier velocity.

With a higher breakdown field, thinner SiC devices can be developed that block a given amount of voltage, compared to silicon devices. The thinner SiC devices are faster switching devices because a smaller volume of charge carriers have to be removed during turn-off. Therefore the power handling capability of SiC GTO thyristors is much better than silicon GTO thyristors. SiC is also physically rugged and chemically inert.

In SiC GTO thyristors, it has been observed that if the gated base region is relatively high doped, the SiC GTO thyristor does not turn on at low current levels. This is because, in the anode, the acceptors being used in silicon carbide require a large amount of energy to be fully ionized so that very few are ionized at typical device operating temperatures. Therefore, there is a low injection of holes from the anode region into the center low doped regions of the SiC GTO thyristor resulting in poor conductivity modulation and poor on state characteristics. A thyristor that is unable to turn-on at low currents is also referred to as one that has a high holding current. On the other hand, a high doped gated base region is desirable because it minimizes current crowding that leads to device failure. As the capability to grow high quality SiC wafers and epi-layers improves, industry will focus more on larger area devices where current crowding will be an important issue.

The applications for SiC GTO thyristors include high voltage DC systems, traction circuits, motor control, power factor control, and other power conditioning circuits. These systems may be found in electric or hybrid electric tanks, electric helicopters, and other vehicles used by the military.

Widespread application in these areas will occur if two issues are addressed. First, the voltage drop across the thyristor in its on state should be reduced. Second, the holding current should be as low as possible. A holding current of 1 A/cm² has been recently stated as desirable. Also, to control large amounts of current as would be required in high end systems, rather than connecting many small devices in parallel it would be better to make several single large area devices. The material quality is expected to improve, but because of the large ionization energy of the acceptor dopant atoms that are currently used in silicon carbide, new techniques to improve the injection efficiency of holes from the anode region should be developed. The present invention, the modified anode gate turn-off (MA-GTO) thyristor, addresses these issues.

Further objects, features and advantages of the invention will become apparent from the following detailed description taken in conjunction with the following drawing.

BRIEF DESCRIPTION OF THE DRAWINGS

Throughout the Figures, reference numerals that are the same refer to the same features.

DETAILED DESCRIPTION OF THE PREFERRED EMBODIMENTS

Figure 1A:
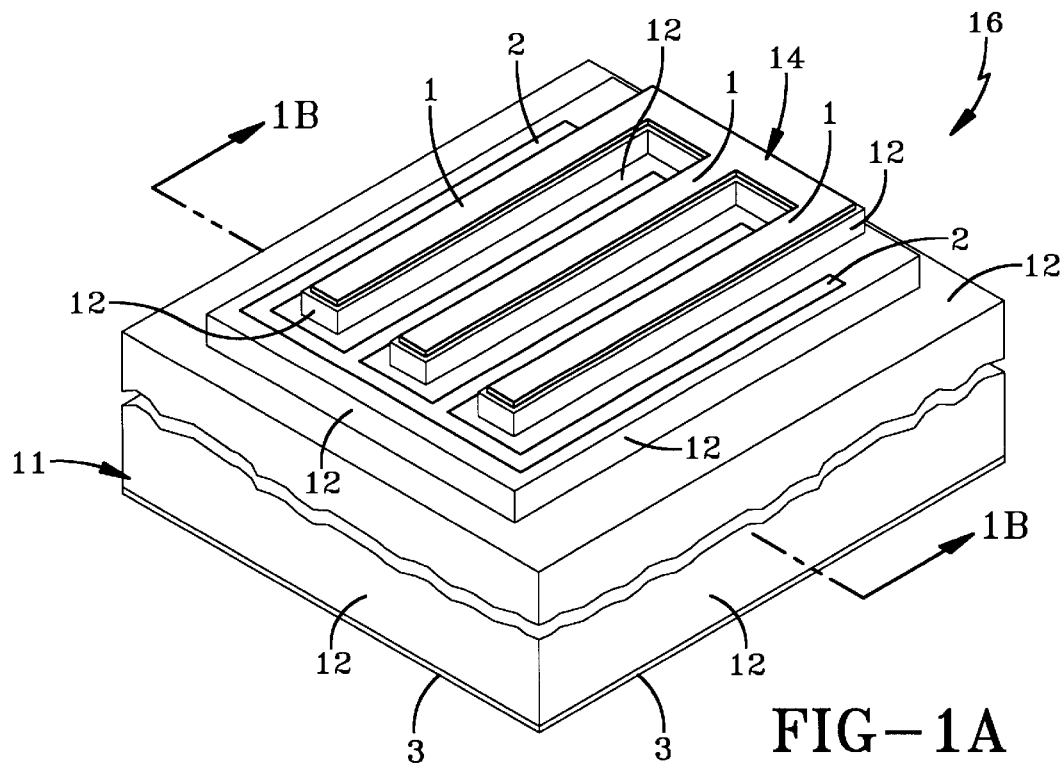
FIG. 1A is a perspective view of an embodiment of the invention.
Figure 1B:
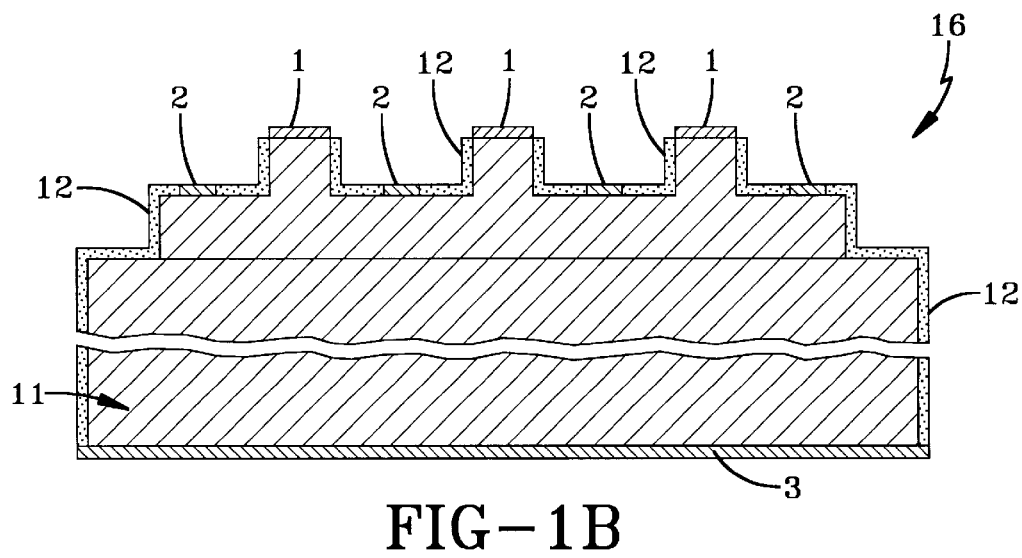
FIG. 1B is a cross-section taken along the line 1B—1B of the embodiment of FIG. 1.

FIG. 1A is a perspective view of an embodiment of a thyristor 16 which includes the invention. FIG. 1B is a cross-section taken along the line 1B—1B of the thyristor 16 of FIG. 1. The thyristor 16 shown in FIGS. 1A and 1B comprises three "fingers" having modified anode regions 14. It should be understood that more or less than three "fingers" may be used by repeating or deleting the structure shown in FIG. 1C.

Figure 1C:
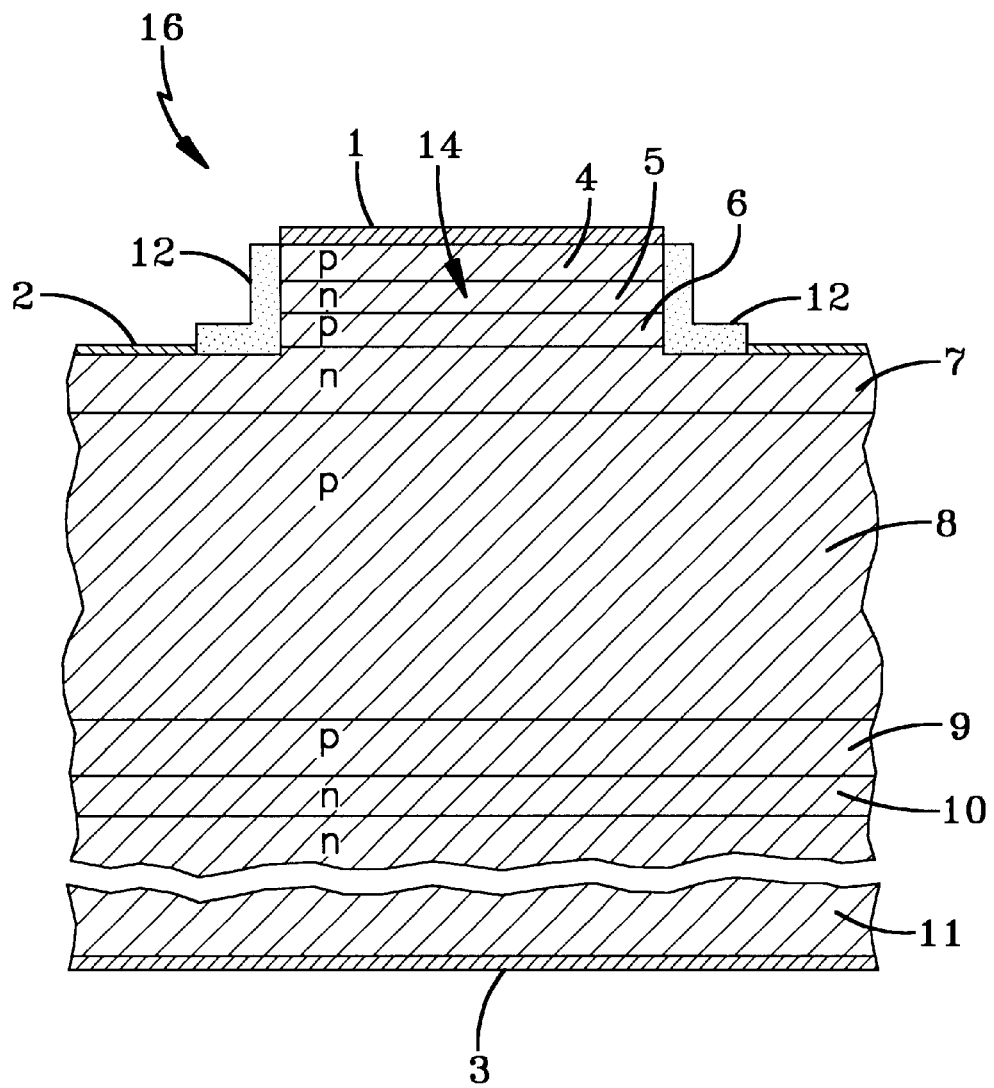
FIG. 1C is an enlarged cross-section of a portion of FIG. 1B.

FIG. 1C is an enlarged cross-section of the middle "finger" of FIG. 1B. Referring to FIGS. 1A, 1B and 1C, a thyristor 16 according to the invention includes a substrate 11, also referred to as a cathode region, formed of n-type silicon carbide; a growth buffer 10 formed of n-type silicon carbide and positioned to overlie the substrate 11; a field buffer region 9 formed of p-type silicon carbide and positioned to overlie the growth buffer 10; a drift region 8 formed of p-type silicon carbide and positioned to overlie the field buffer region 9; a gated base region 7 formed of n-type silicon carbide and positioned to overlie the drift region 8; and a modified anode region 14.

As best seen in FIG. 1C, the modified anode region 14 is formed of first, second and third layers 6, 5, 4 of silicon carbide and positioned to overlie the gated base region 7. The first layer 6 comprises p-type silicon carbide and is disposed adjacent the gated base region 7. The second layer 5 comprises n-type silicon carbide and is disposed adjacent the first layer 6. The third layer 4 comprises p-type silicon carbide and is disposed adjacent the second layer 5. An anode contact 1 is disposed on the third layer 4 of the modified anode region 14. A cathode contact 3 is disposed on the substrate 11. A gate contact 2 is disposed on the gated base region 7. Each of the thicknesses of the first layer 6 and the second layer 5 of the modified anode region 14 is less than the thickness of the third layer 4 (see representative thickness dimensions in TABLE 1). Preferably, the thickness of the first layer 6 of the modified anode region 14 is less than one-fifth the diffusion length of free carriers in the silicon carbide comprising the first layer 6. Similarly, the thickness of the second layer 5 of the modified anode region 14 is preferably less than one-fifth the diffusion length of free carriers in the silicon carbide comprising the second layer 5.

Preferably, a passivation material 12 is disposed on external surfaces of the gate turn-off thyristor 16 that are not otherwise covered by the anode contact 1, cathode contact 3 or gate contact 2. The passivation material 12 comprises, for example, silicon dioxide. The cathode contact 3 and the gate contact 2 preferably comprise nickel or a nickel alloy. The anode contact 1 preferably comprises aluminum, titanium or an aluminum alloy.

As best seen in FIG. 1C, the SiC layers from top to bottom form a p-n-p-n-p-p-n-n structure. As is known in the art, n-type and p-type refer to the majority charge carriers that are present in the region. In an n-type region "electrons" are the majority carriers, and in a p-type region "holes" (the absence of electrons) are the majority carriers. To make a region n-type, additional nitrogen atoms impurities (donors, $N_D$) are typically added to the SiC crystal. To make a region p-type, aluminum impurities (acceptors, $N_A$) are typically added to the SiC crystal.

Figure 2:
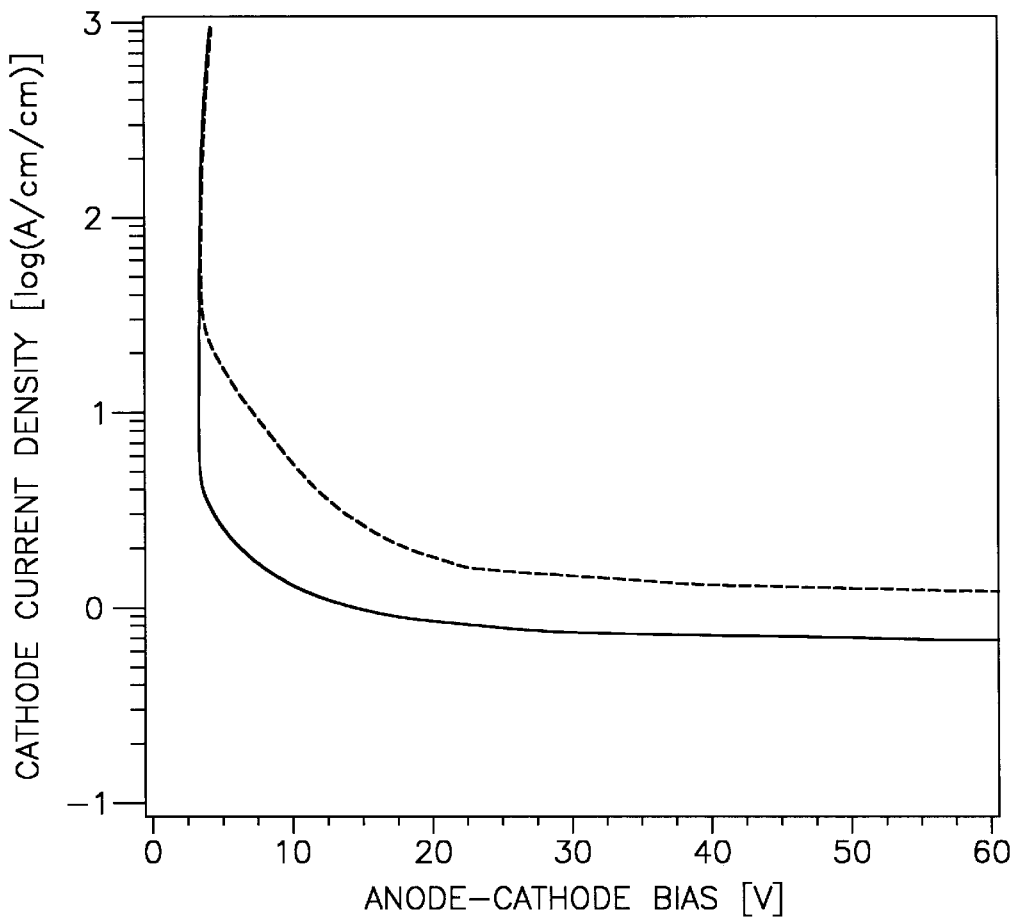
FIG. 2 is a plot of current density versus voltage for a thyristor according to the invention (solid line) and for a conventional SiC GTO (dotted line).

The results shown in FIGS. 2–7 were produced using the Atlas/Blaze drift-diffusion model simulation software. FIG. 2 is a plot of current density versus voltage for the MA-GTO thyristor 16 (solid line) and for a conventional SiC GTO thyristor (dotted line). FIG. 2 shows the current through the cathode contact 3 versus the voltage drop from the anode contact 1 to the cathode contact 3 for a fixed reverse bias current at the gate contact 2. The concentrations and thickness of the structure simulated is shown in Table 1.

TABLE 1

| Layer number from FIG. 1C | Thickness in vertical direction (microns) | Dopant Concentration, $N_A$ = Acceptor, $N_D$ = Donor (cm⁻³) |
| --- | --- | --- |
| 4 | 2 | $N_A = 1 \times 10^{19}$ |
| 5 | 0.1 | $N_D = 1 \times 10^{17}$ |
| 6 | 0.1 | $N_A = 1 \times 10^{17}$ |

TABLE 1-continued

| Layer number from FIG. 1C | Thickness in vertical direction (microns) | Dopant Concentration, $N_A$ = Acceptor, $N_D$ = Donor (cm$^{-3}$) |
| --- | --- | --- |
| 7 | 1 | $N_D = 7 \times 10^{18}$ |
| 8 | 6 | $N_A = 1 \times 10^{15}$ |
| 9 | 1 | $N_A = 1 \times 10^{19}$ |
| 10 | 4 | $N_D = 5 \times 10^{18}$ |
| 11 | 295 | $N_D = 5 \times 10^{18}$ |

Figure 3:
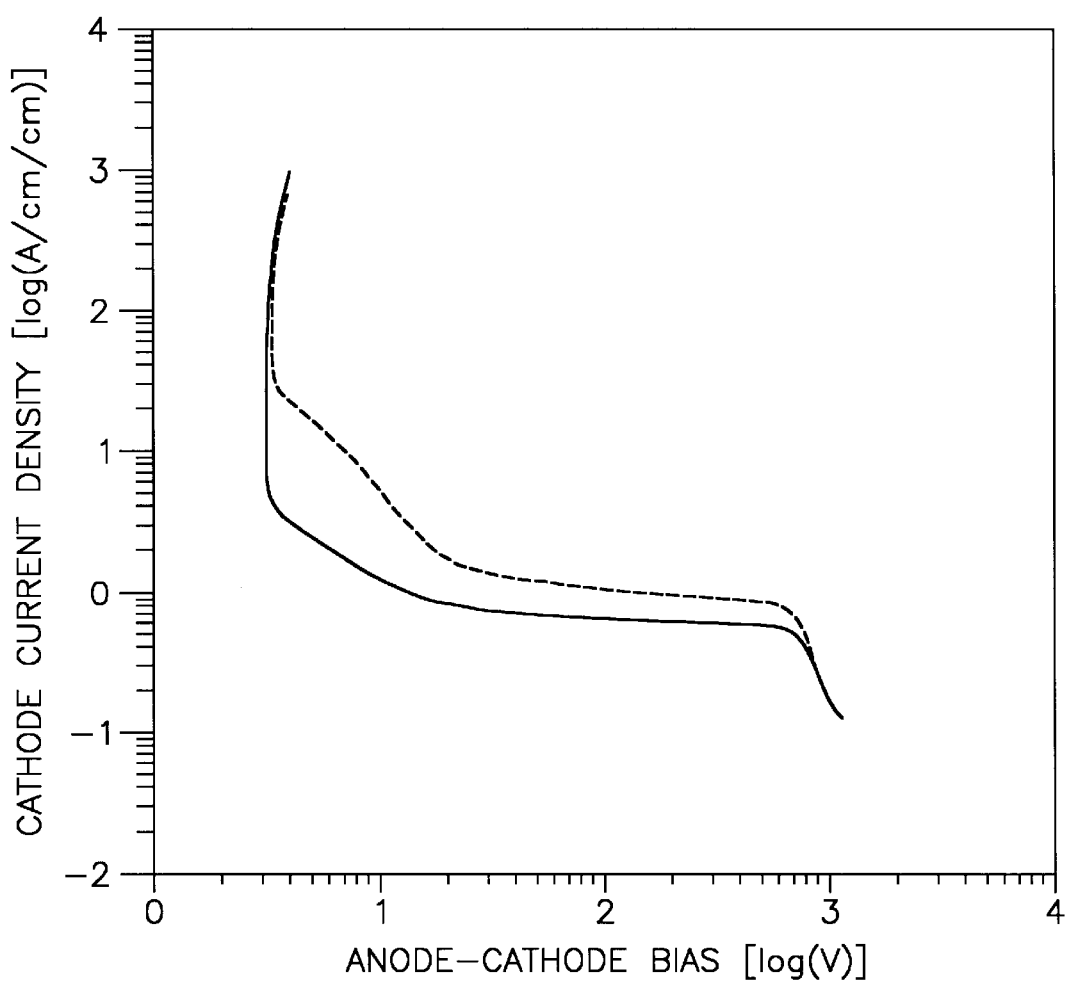
FIG. 3 is another plot of current density versus voltage for a thyristor according to the invention (solid line) and for a conventional SiC GTO (dotted line).

If layers 5 and 6 are removed from the thyristor 16, the current-voltage characteristic is the dotted line in FIG. 2. FIG. 2 indicates that including the layers 5 and 6 reduces the holding current and the on-state voltage drop. FIG. 3 is another plot of current density versus voltage for a thyristor according to the invention (solid line) and for a conventional SiC GTO (dotted line). FIG. 3 presents the same type of information as FIG. 2, but with the x-axis expanded and on a log scale. FIG. 3 indicates that the maximum voltage blocked is not affected by adding layers 5 and 6.

Figure 4B:
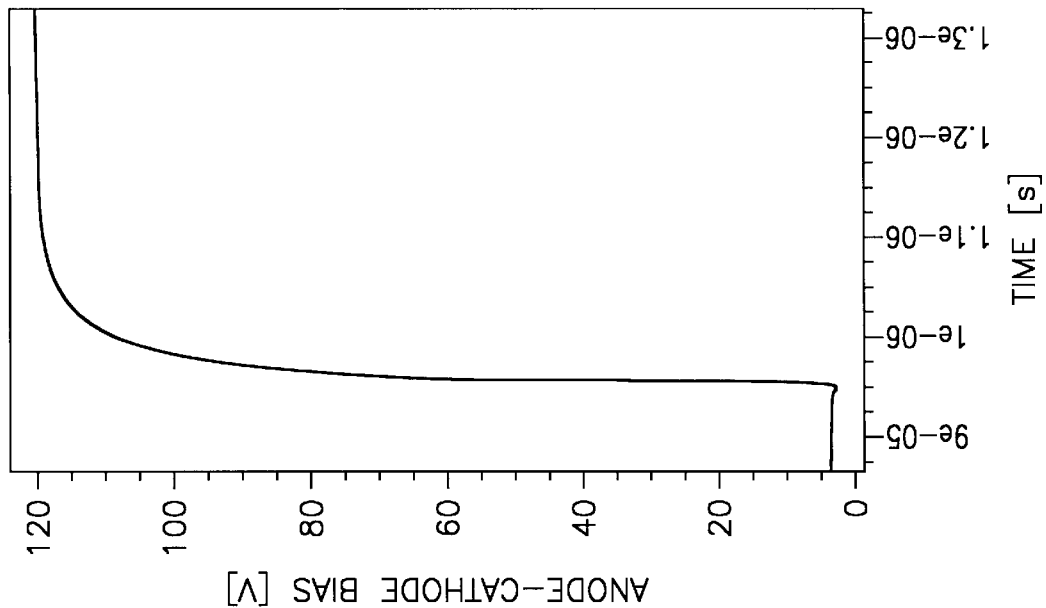
FIG. 4B is a plot of anode-cathode bias versus time when switching off the inventive thyristor.
Figure 4A:
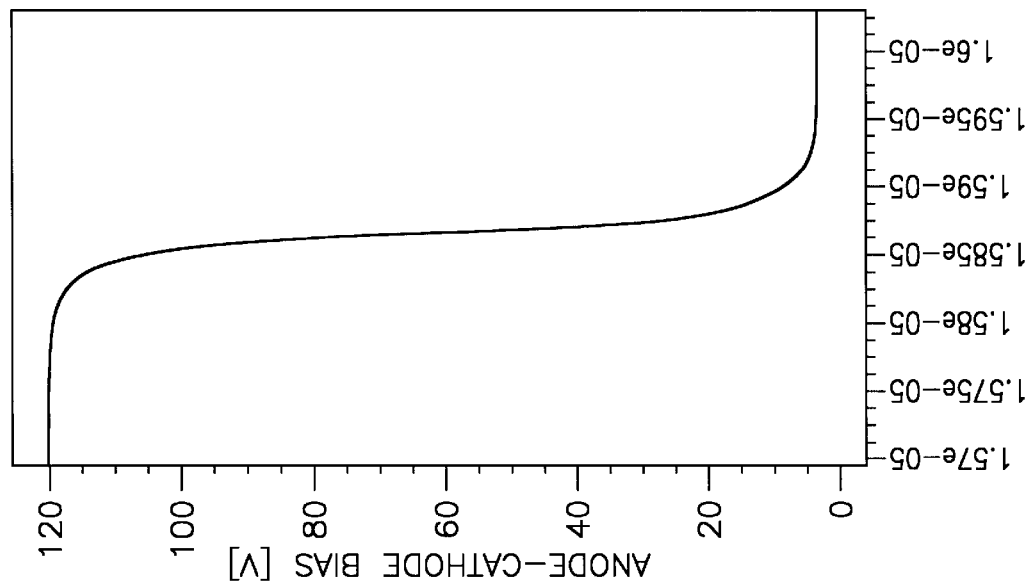
FIG. 4A is a plot of anode-cathode bias versus time when switching on the inventive thyristor.

As in the case of prior GTO thyristors, the thyristor 16 of the invention is switched on by applying a forward bias from anode to gate and switched off by applying a reverse bias from anode to gate. The thyristor 16 is switched off by the gate turn-off mechanism that occurs in other SiC GTO thyristor structures. FIGS. 4A and 4B indicate the voltage drop from anode to cathode as the thyristor 16 switches on and off several kiloamps of current through a 135 ohm load.

Referring to FIG. 1C, layers 5 and 6 enhance the injection of holes from layer 4 into regions 7, 8, and 9. Layers 5 and 6, taken together with layer 4 and region 7, form a "secondary" thyristor. The high injection of holes into the low doped layers 5 and 6 improves the injection of holes into the base regions 7, 8, and 9 of the thyristor 16. It should be noted that if layers 5 and 6 are too thick, the thyristor 16 cannot be easily turned on with a gate drive circuit between the gate contact 2 and the anode contact 1. This is because the turn on pulse will merely increase the voltage over the "secondary" thyristor formed by layers 4, 5, 6 and region 7, which is in its blocking state. Other design rules for optimizing the performance of a SiC GTO thyristor apply to thyristor 16, including increasing the maximum blocked voltage and the turn-off gain.

Figure 5B:
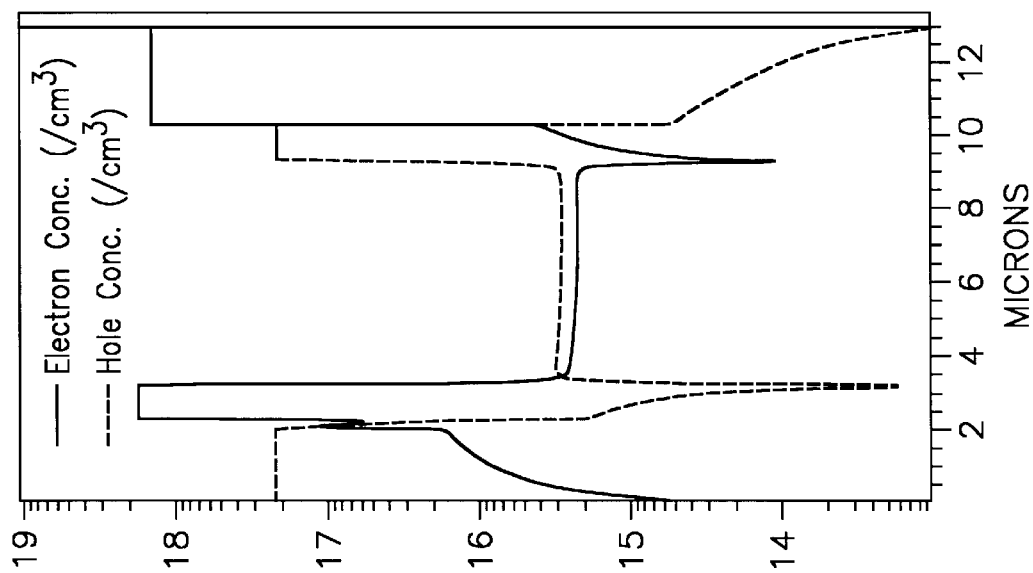
FIG. 5B is a plot of electron and hole concentrations along a vertical cut at x=1 microns on the section of FIG. 5A.
Figure 5A:
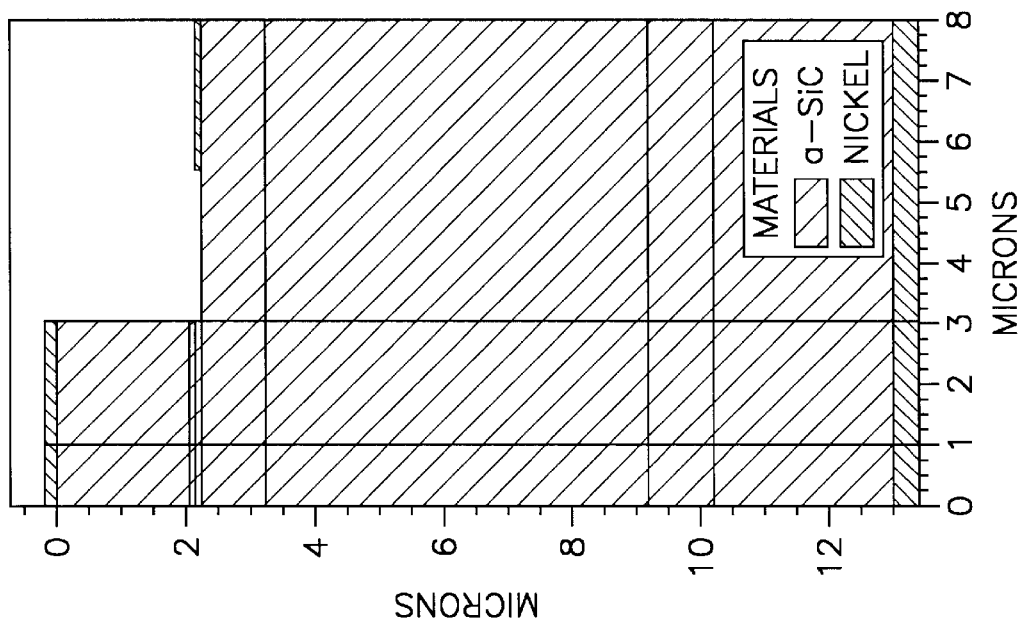
FIG. 5A is a cross-section of the thyristor 16 scaled in microns (substrate not included).
Figure 6:
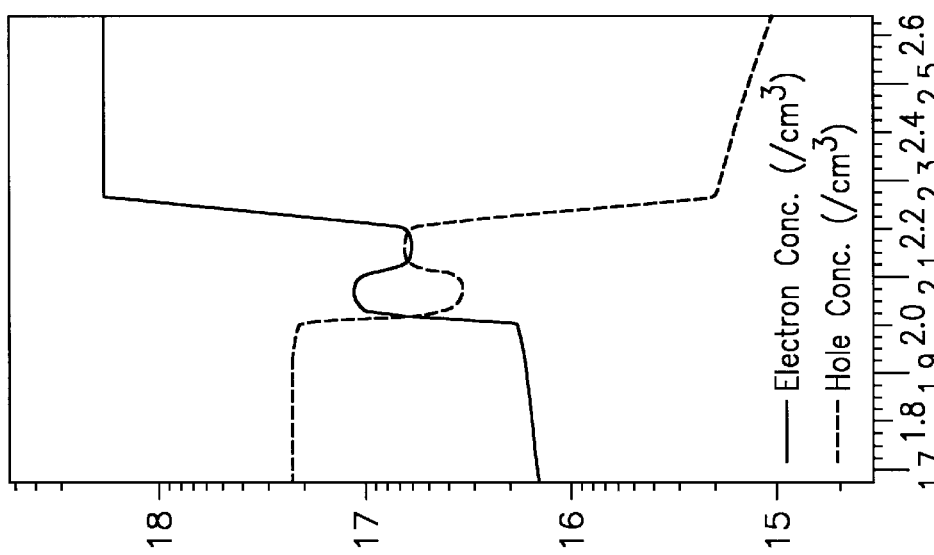
FIG. 6 is a plot of electron and hole concentrations along the vertical cut of FIG. 5A between y=1.7 microns and y=2.6 microns (layers 5 and 6 of FIG. 1C).

FIG. 5A is a cross-section of the thyristor 16 scaled in microns (substrate not included). FIG. 5B is a plot of electron and hole concentrations along a vertical cut at x=1 microns on the section of FIG. 5A. For this case, 10 A/cm$^2$ current density was at the cathode. The solid line represents electrons and the dotted line represents holes. FIG. 6 is a plot of electron and hole concentrations along the vertical cut of FIG. 5A between y=1.7 microns and y=2.6 microns (layers 5 and 6 of FIG. 1C). FIG. 6 is essentially an enlarged view of a portion of FIG. 5B indicating the high injection of holes and electrons taking place in layers 5 and 6 of thyristor 16.

Figure 7B:
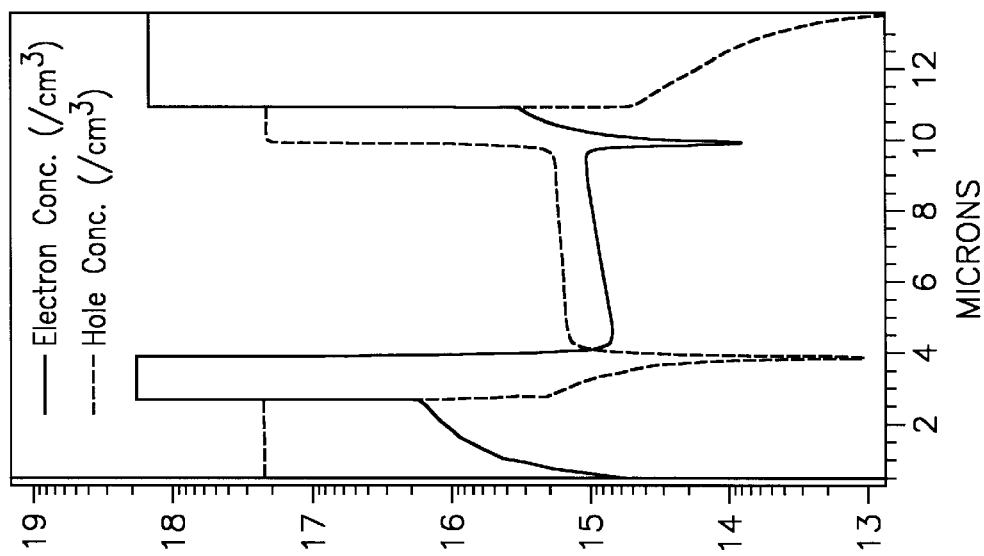
FIG. 7B is a plot of electron and hole concentrations along a vertical cut at x=1 microns on the section of FIG. 7A.
Figure 7A:
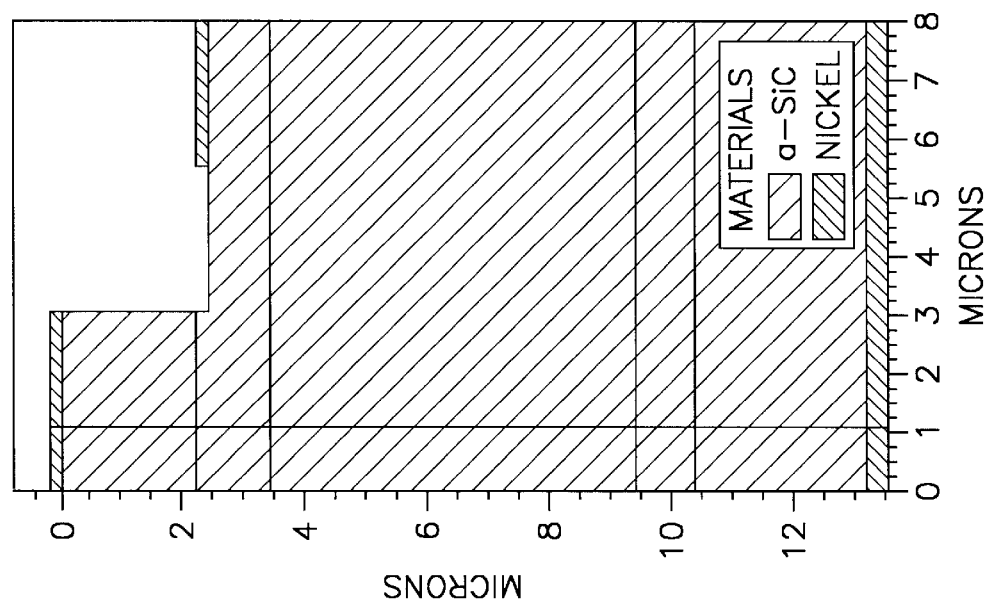
FIG. 7A is a cross-section of a conventional thyristor scaled in microns (substrate not included).

FIG. 7A is a cross-section of a conventional SiC GTO thyristor scaled in microns (substrate not included). FIG. 7B is a plot of electron and hole concentrations along a vertical cut at x=1 microns on the section of FIG. 7A. The conventional thyristor is the same one that produced the dotted line in FIG. 2. By comparing FIGS. 5B and 7B, one sees that the invention, the MA-GTO thyristor, has better conductivity modulation in the drift region than the conventional SiC GTO thyristor.

Prior SiC GTO thyristors are p-n-p-n (termed symmetric) or p-n-p-p-n (termed antisymmetric) type structures. These structures have an upper limit on the concentration of dopant atoms that can be placed in the gated base region. A prior art structure would be FIG. 1 without layers 5 and 6, and with region 4 touching region 7. If the donor concentration of region 7 is high (above $1 \times 10^{18}$ cm$^{-3}$ as discussed in P. B. Shah, et. al., Solid State Elect., p. 353–358, vol. 44/2, 2000), the voltage drop across the device from anode to cathode would be very high. Also, the holding current would be high. The example in FIG. 2 (dotted line) shows that the prior art SiC GTO thyristor has a holding current of 60 A/cm$^2$ rather than 9 A/cm$^2$ for the invention, the MA-GTO thyristor. Greater improvements have been observed for simulations of other structures and when certain material parameters such as lifetimes are changed.

The invention allows one to increase the dopant concentration of the gated base region 7 over that normally encountered in conventional SiC GTO thyristor structures. In very large area silicon GTO thyristors, if the conductivity of the gate contacted region (i.e. region 7 in FIG. 1C) is low, current crowding occurs. By increasing the dopant concentration of that region, current crowding can be avoided during turn-off and uniform turn-off can occur. Current crowding is a destructive mechanism that leads to the formation of current filaments and thermal instability. It also leads to nonuniform electric fields in the depletion region and early punchthrough breakdown.

The invention also provides a means of reducing the on-state voltage drop and holding current of the SiC GTO thyristor. A reduced on-state voltage drop means that the device can handle greater power in the on-state, and a reduced holding current means that the device has a larger on-state current range.

As one makes larger area multi-emitter SiC GTO thyristors to handle large currents, current crowding will become more of a problem because it introduces destructive mechanisms that affect the performance of the device such as current filamentation, and nonuniform switching. To prevent current crowding it has been suggested that one can increase the dopant concentration of the gated n base region to increase its conductivity. However, many researchers have observed that increasing the concentration of that region worsens the injection of holes from the anode into the center regions of the GTO thyristor and hampers conductivity modulation. Poor conductivity modulation of those regions leads to a high voltage drop across the device in its on state, as well as a high holding current or equivalently a small on-state current range. Also, in general, because of the high ionization energy of the acceptors the onstate voltage drop of SiC GTO thyristors is high.

The invention would provide better performance than any other known high temperature, high power semiconductor switch in power conversion systems such as inverter circuits and converter circuits for used in traction applications, etc. Thyristors are expected to handle much higher voltages and currents than other devices such as the insulated gate bipolar transistor (IGBT).

While the invention has been described with reference to certain preferred embodiments, numerous changes, alterations and modifications to the described embodiments are possible without departing from the spirit and scope of the invention, as defined in the appended claims and equivalents thereof.

What is claimed is:

1. A gate turn-off thyristor, comprising:
    a substrate formed of n-type silicon carbide;
    a growth buffer formed of n-type silicon carbide and positioned to overlie said substrate;

a field buffer region formed of p-type silicon carbide and positioned to overlie said growth buffer;

a drift region formed of p-type silicon carbide and positioned to overlie said field buffer region;

a gated base region formed of n-type silicon carbide and positioned to overlie said drift region;

a modified anode region formed of first, second and third layers of silicon carbide and arranged in a stacked array positioned to overlie said gated base region, said first layer comprising p-type silicon carbide and overlying said gated base region, said second layer comprising n-type silicon carbide and overlying said first layer, and said third layer comprising p-type silicon carbide and overlying said second layer;

an anode contact disposed on said third layer of said modified anode region;

a cathode contact disposed on said substrate; and a gate contact disposed on said gated base region.

2. The gate turn-off thyristor of claim 1 further comprising passivation material disposed on external surfaces of said gate turn-off thyristor not otherwise covered by one of said anode contact, said cathode contact and said gate contact.

3. The gate turn-off thyristor of claim 2 wherein said passivation material comprises silicon dioxide.

4. The gate turn-off thyristor of claim 1 wherein said cathode contact and said gate contact comprise nickel.

5. The gate turn-off thyristor of claim 1 wherein said anode contact comprises one of aluminum and titanium.

6. the gate turn-off thyristor of claim 1 wherein each of the thicknesses of said first layer and said second layer of said modified anode region is less than a thickness of said third layer of said modified anode region.

7. The gate turn-off thyristor of claim 1 wherein a thickness of said first layer of said modified anode region is less than one-fifth a diffusion length of free carriers in the silicon carbide comprising said first layer and a thickness of said second layer of said modified anode region is less than one-fifth a diffusion length of free carriers in the silicon carbide comprising said second layer.

* * * * *